United States Patent
Wohlfahrt et al.

(10) Patent No.: US 6,807,084 B1
(45) Date of Patent: Oct. 19, 2004

(54) FERAM MEMORY DEVICE

(75) Inventors: Joerg Wohlfahrt, Kanagawa-ken (JP);
Hans-Oliver Joachim, Kanagawa-ken (JP)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/418,734

(22) Filed: Apr. 17, 2003

(51) Int. Cl.$^7$ .............................................. G11C 11/22
(52) U.S. Cl. ..................................................... 365/145
(58) Field of Search .............................. 365/145, 149, 365/117, 65, 233

(56) References Cited

U.S. PATENT DOCUMENTS

| | | | |
|---|---|---|---|
| 5,539,279 A | * | 7/1996 | Takeuchi et al. ............ 365/145 |
| 6,370,058 B1 | * | 4/2002 | Fukumoto .............. 365/185.08 |
| 6,473,828 B1 | * | 10/2002 | Matsui ....................... 365/233 |

* cited by examiner

Primary Examiner—Thong Q. Le
(74) Attorney, Agent, or Firm—Fish & Richardson P.C.

(57) ABSTRACT

A FeRAM memory chip comprises an array 5 of non-volatile ferrocapacitor memory cells for storing data. Input pins receive data to be stored, and address data indicating where in the array of memory cells the data should be stored. The FeRAM memory chip further has a reset unit 7 for recognizing an externally applied reset signal. The reset unit 7, upon recognition of the reset signal, initiates a reset operation in which at least a portion of the data stored in the memory cells is set to predetermined values.

9 Claims, 1 Drawing Sheet

FERAM MEMORY DEVICE

FIELD OF THE INVENTION

The present invention relates to an FeRAM memory chip, as well as to a method of operating such a memory chip.

BACKGROUND OF INVENTION

FeRAM memory chips are now in common use. One beneficial characteristic of these chips is that they are non-volatile, which means that if the power supply to the FeRAM memory chip is removed, the data stored in the device is not deleted. This characteristic is in contrast to certain other memory devices, such as DRAM devices, which forget their data as soon as the power supply is switched off.

A typical application for a non-volatile memory chip is a RAM memory for a low power device. Such devices may have an unreliable power supply, or may be designed to stop drawing power whenever possible, such as when the device is not in use. The advantage of providing a low-power device with a non-volatile memory chip as the RAM memory is that, after a power down, any code (e.g. operating system program code or application programs) stored in the non-volatile memory is not deleted. This means that then the device is powered-up again, the system would be in the same state as before the power off. The device does not have to be rebooted for example.

Another application of non-volatile memory chips is as simple data storage devices.

The overall structure of a known FeRAM memory chip is shown schematically in FIG. 1. The device has a number of pins including pins which are referred to in this document as data transfer pins. The data transfer pins are for receiving data to be stored and address data indicating where in the memory the data should be stored, and for outputting data stored in the memory cells. In some memory chips the pins for receiving the data and addresses ("input pins") are different pins from the pins which output data ("output pins"). However, in other memory chips the same pins may act as input or as output pins at different times.

The memory chip shown in FIG. 1 includes two input pins marked as "data" and "address". The pins "data" and "address" respectively receive data to be stored in the device and an address at which that data is to be stored. The memory chip further includes control pins (not shown), such as a chip enable (CE) pin, or an output enable (OE) pin, for receiving commands.

The memory chip has an address decoder which includes a word line address decoder (not shown) which uses the address to obtain a word line address (corresponding to a row of the memory array), and a column decoder 1 which uses the address to obtain the column address.

The memory chip further includes for each column a corresponding sense amplifier 3. Only one of these is shown in FIG. 1 for simplicity. The column address selects a sense amplifier 3, and the word line address (row) selects one cell of the corresponding column. The sense amplifier 3 is arranged to read data out of the selected cell of the selected column, or to write data to into the selected cell of the selected column, based on the a clock signal received through a clock pin (not shown) of the memory chip and the control signals (e.g. CE, OE).

As shown in FIG. 1, the columns are each made up of two chain cell arrays 5, and the sense amplifiers 3 are shared between those two adjacent chain cell arrays 5. For example, word lines addresses 0, . . . 255 might be in the left hand chain cell array 5, and word line addresses 256–511 might be in the right hand chain cell array 5. However, many other possible arrangements are known.

SUMMARY OF THE INVENTION

The present inventors have appreciated that, although non-volatile FeRAM memory devices are certainly useful, there are circumstances in which it is not desirable that the data stored inside the memory should be retained.

For example, following a system failure, it would be helpful if all system components could be reset into a defined state, rather than simply returning to their state before the system failure. Furthermore, if a low power device experiences an application failure such as a crash, it would be desirable if the data in the memory (which may have led to the crash) is removed, and if the application program itself is erased from the memory. Furthermore, in cases in which the memory chip is used for storage only, a deliberate erasal of the memory may be desirable when the device is used in an environment with only limited operating system capabilities.

For this reason, the present invention proposes in general terms that a FeRAM memory chip should include a reset unit for recognizing an externally applied reset signal. The reset unit is arranged upon recognition of this reset signal to initiate an operation in which at least a portion, and preferably all, of the FeRAM memory is erased.

The reset unit may be arranged to perform this reset operation as a sequence of reset steps in which respective sections of the memory are reset. In this way, the peak power required to perform the reset operation may be kept to an acceptably low level. A balance can be achieved between the speed of the reset and the power requirement.

There are various forms which the reset signal may take in different embodiments of the invention.

One option is for the memory chip to have a dedicated pin input for receiving a reset signal, so that the reset unit can initiate the reset operation upon measuring that a voltage on this pin reaches a certain level.

Another option, which does not require a dedicated pin and therefore which is cheaper to implement, is for the reset unit to be sensitive to a reset signal applied as voltages on one or more pins which are otherwise used for inputting data to the memory chip.

For example, the reset signal may be that the voltage on one of the input pins is set to a voltage which is not encountered in the usual operation of the chip (e.g. a voltage which is higher than the voltages which are encountered on that input pin when data is transmitted to the memory chip for storage).

Alternatively, the reset signal may be a pattern of voltages over a period of time which is not encountered in the usual operation of the memory chip, such as a non-standard sequence of voltages on the clock-pin.

More generally, the reset signal may be any "soft entry" command. "Soft entry" is a sequence of non-standard clock signals and commands (e.g. a series of "1" and "0" s on selected data pins) applied to the memory chip's data pins. As in some known memory chips, the chip according to the present invention may have a soft entry decoder unit for recognising a limited set of commands (e.g. that the voltage power input $V_{DC}$ is the default $V_{DC}$ plus 30 mV) as a reset signal.

A further aspect of the invention provides a method of using a memory chip as defined above, comprising supplying a reset signal to the memory chip, whereby the reset unit instates an operation in which at least a portion, and preferably all, of the FeRAM memory is erased.

A further expression of the invention is a device, such as a low power device, comprising a memory chip as defined above, and a processor operative to store data in the memory chip and retrieve the stored data from the memory chip, the processor further being operative to generate a reset signal and transmit it to the memory chip.

BRIEF DESCRIPTION OF THE FIGURES

Preferred features of the invention will now be described, for the sake of illustration only, with reference to the following figures in which.

DETAILED DESCRIPTION OF THE EMBODIMENTS

Figure 1:
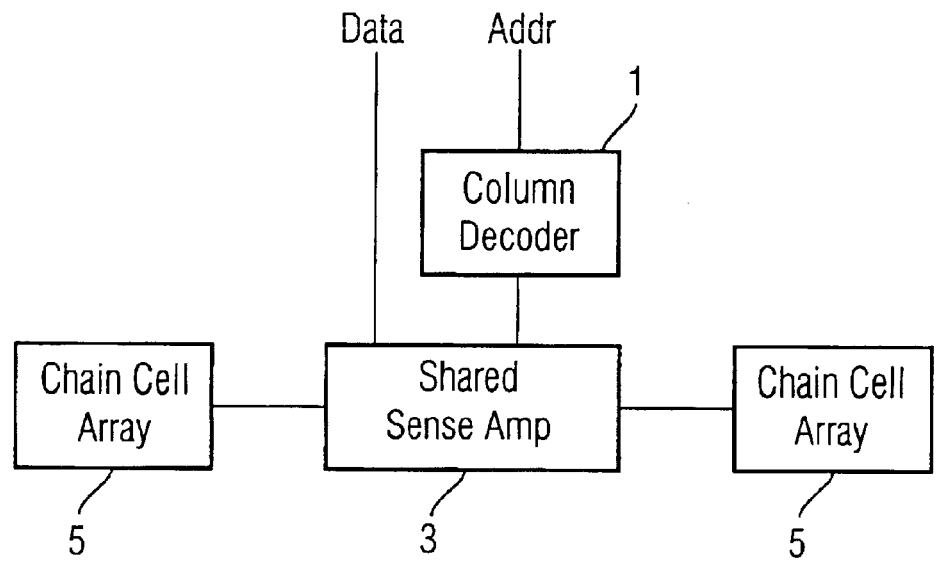
FIG. 1 shows an access scheme of a known FeRAM device.
Figure 2:
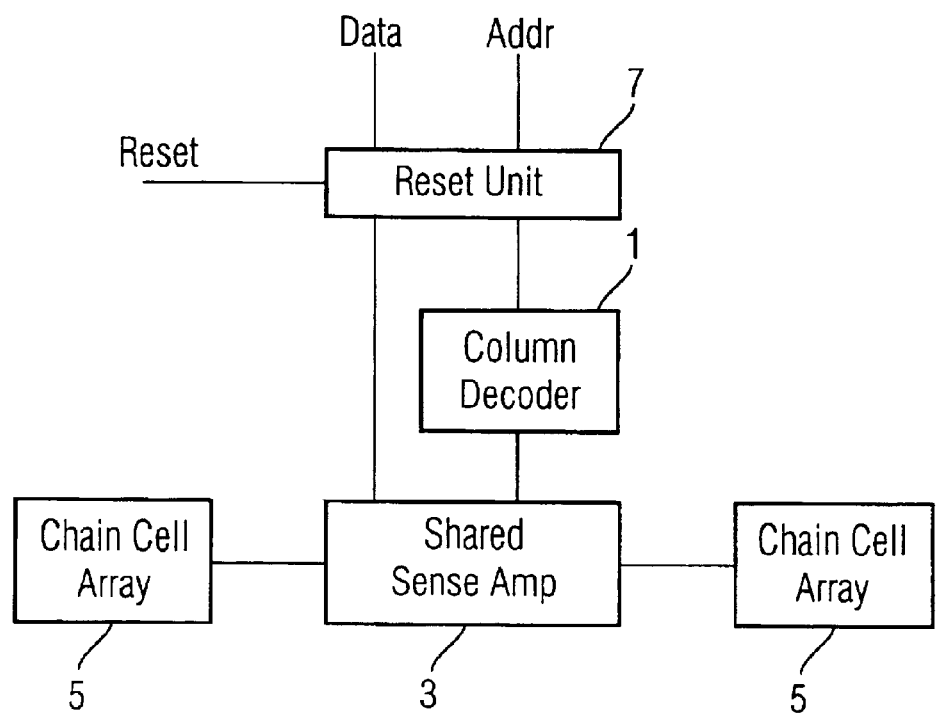
FIG. 2 shows an access scheme of a FeRAM device according to the invention.

Turning to FIG. 2, an embodiment of the invention is shown schematically. Elements which correspond to those of the known memory chip shown in FIG. 1 are labelled by the same reference numerals, and these elements have the same construction as in known memory chips.

The differences between the known FeRAM memory chip and the embodiment shown in FIG. 2 are that the embodiment has an additional pin, for receiving an input signal "reset", and that the embodiment additionally has a reset unit 7, which is arranged to receive the "reset" signal and also the "data" and "Addr" signals. It should be understood that the memory chip of FIG. 2 shares with the memory chip of FIG. 1 a number of features which are not shown in either diagram, such as pins for receiving commands (e.g. read/write), clock pins, and one or more output pins for outputting stored data when the chip is commanded to do so. Note that in certain embodiments the output pin(s) may be the same as the input pin(s) which receive the data. That is, these pin(s) have a different function according to whether the memory chip is commanded to read or write data.

The reset unit 7 is arranged in normal operation to output the signals "data" and "Addr" which it receives, unchanged, respectively to the shared sense amplifier 3 and the column decoder 1. In this case, the operation of the shared sense amplifier 3 and the chain cell array 5 is as in the known embodiment.

However, if the reset signal is sent to the reset unit 7, the reset unit 7 registers this fact and initiates an operation in which the outputs it sends to the column decoder 1 and the shared sense amplifier 3 are such as to set the values of the data stored in the memory cells to be set to one or more predetermined values (e.g. all set to the same value, i.e. all "0" or all "1"). This operation is a sequence of steps, each performed on a respective clock cycle. For example, at each cycle a respective set of banks (word lines) may be opened in parallel, and the predetermined values can be written to the cells.

Although the invention has been described in relation to a single embodiment only, many variations are possible within the scope of the invention as will be clear to a skilled reader. For example, as mentioned above, the reset signal does not require a dedicated pin. Instead the reset cell 7 may be arranged to recognize the reset signal from a pattern of voltage values (applied all at once, or over a period of time) on one or more of the pins through which the FeRAM receives the inputs "data" and/or "Addr" and/or the clock signal (this input is not shown in FIG. 1 or 2).

What is claimed is:

1. A FeRAM memory chip comprising: an array of non-volatile ferrocapacitor memory cells for storing data, a plurality of pins, the pins including data transfer pins for receiving data to be stored and address data indicating where in the array of memory cells the data should be stored, and for outputting data stored in the memory cells, and a reset unit for recognizing a reset signal applied to the memory chip through one or more of the pins, the reset unit being arranged upon recognition of the reset signal to initiate a reset operation in which at least a portion of the data stored in the memory cells is set to one or more predetermined values.

2. A memory chip according to claim 1 in which during the reset operation the data stored in all the memory cells is set to the predetermined value or values.

3. A memory chip according to claim 1 in which the pins further include a clock pin for receiving a clock timing signal, the reset operation including in different clock periods, resetting the data in different respective subsets of the memory cells to the predetermined value or values.

4. A memory chip according to claim 1 in which the pins further include a dedicated pin for receiving a reset signal, the reset unit being arranged to initiate the reset operation upon measuring that a voltage on this pin is at a certain level.

5. A memory chip according to claim 1 in which pins include the reset unit is arranged to recognize the reset signal from the voltages on one or more of the data transfer pins and/or one or more command pins and/or a clock pin.

6. A memory chip according to claim 5 in which the reset unit is arranged to recognize the reset signal as a voltage which does not occur during the transmittal to the memory chip of data for storage.

7. A memory chip according to claim 5 in which the reset unit is arranged to recognize the reset signal as a pattern of voltages which does not occur during the transmittal to the memory chip of data for storage.

8. A method of operating an FeRAM memory chip comprising:

an array of non-volatile ferrocapacitor memory cells for storing data, a plurality of pins, the pins including data transfer pins for receiving data to be stored and address data indicating where in the array of memory cells the data should be stored, and for outputting data stored in the memory cells, and a reset unit for recognizing a reset signal applied to the memory chip through one or more of the pins, the reset unit being arranged upon recognition of the reset signal to initiate a reset operation in which at least a portion of the data stored in the memory cells is set to one or more predetermined values, the method comprising supplying a reset signal to the memory chip, whereby the reset unit initiates an operation in which at least a portion of the FeRAM memory is erased.

9. An electronic device comprising:

a FeRAM memory chip comprising an array of non-volatile ferrocapacitor memory cells for storing data, a plurality of pins, the pins including data transfer pins for receiving data to be stored and address data indicating where in the array of memory cells the data should be stored, and for outputting data stored in the memory cells, and a reset unit for recognizing a reset signal applied to the memory chip through one or more of the pins, the reset unit being arranged upon recognition of the reset signal to initiate a reset operation in which at least a portion of the data stored in the memory cells is set to one or more predetermined values, and a processor operative to store data in the memory chip and retrieve the stored data from the memory chip, the processor further being operative to generate a reset signal and transmit it to the memory chip.

* * * * *